US012305281B2

(12) United States Patent
Yoshida et al.

(10) Patent No.: US 12,305,281 B2
(45) Date of Patent: *May 20, 2025

(54) METHOD FOR FORMING METAL SILICON OXIDE AND METAL SILICON OXYNITRIDE LAYERS

(71) Applicant: ASM IP Holding B.V., Almere (NL)

(72) Inventors: Takashi Yoshida, Fuchu (JP); René Vervuurt, Leuven (BE)

(73) Assignee: ASM IP Holding B.V., Almere (NL)

( * ) Notice: Subject to any disclaimer, the term of this patent is extended or adjusted under 35 U.S.C. 154(b) by 45 days.

This patent is subject to a terminal disclaimer.

(21) Appl. No.: 18/207,806

(22) Filed: Jun. 9, 2023

(65) Prior Publication Data

US 2023/0349043 A1 Nov. 2, 2023

Related U.S. Application Data

(63) Continuation of application No. 17/408,940, filed on Aug. 23, 2021, now Pat. No. 11,725,280.

(Continued)

(51) Int. Cl.
| | | |
|---|---|---|
| C23C 16/40 | (2006.01) | |
| C23C 16/455 | (2006.01) | |
| C23C 16/458 | (2006.01) | |
| C23C 16/52 | (2006.01) | |
| C23C 16/30 | (2006.01) | |

(52) U.S. Cl.
CPC .. *C23C 16/45553* (2013.01); *C23C 16/45502* (2013.01); *C23C 16/45534* (2013.01); *C23C 16/45542* (2013.01); *C23C 16/458* (2013.01); *C23C 16/52* (2013.01); *C23C 16/308* (2013.01); *C23C 16/402* (2013.01)

(58) Field of Classification Search
CPC ..... C23C 16/455; C23C 16/458; C23C 16/52; C23C 16/45542; C23C 16/308; C23C 16/402; C23C 16/405
See application file for complete search history.

(56) References Cited

U.S. PATENT DOCUMENTS

| | | | |
|---|---|---|---|
| 7,687,409 B2 * | 3/2010 | Ahn | C23C 16/401 |
| | | | 438/763 |
| 7,972,977 B2 * | 7/2011 | Wang | C23C 16/45531 |
| | | | 257/E21.639 |

(Continued)

OTHER PUBLICATIONS

Kamada, Takeshi, et al., "Structure and Properties of Silicon Titanium Oxide Films Prepared by Plasma-Enhanced Chemical Vapor Deposition Method". Japanese Journal of Applied Physics, vol. 30, No. 12B, Dec. 1991, pp. 3594-3596.*

(Continued)

*Primary Examiner* — Bret P Chen
(74) *Attorney, Agent, or Firm* — Snell & Wilmer L.L.P.

(57) ABSTRACT

Methods of forming metal silicon oxide layers and metal silicon oxynitride layers are disclosed. Exemplary methods include providing a silicon precursor to the reaction chamber for a silicon precursor pulse period, providing a first metal precursor to the reaction chamber for a first metal precursor pulse period, and providing a first reactant to the reaction chamber for a first reactant pulse period, wherein the silicon precursor pulse period and the first metal precursor pulse period overlap.

20 Claims, 12 Drawing Sheets

Related U.S. Application Data

(60) Provisional application No. 63/070,668, filed on Aug. 26, 2020.

(56) References Cited

U.S. PATENT DOCUMENTS

| | | | | |
|---|---|---|---|---|
| 9,139,906 | B2* | 9/2015 | Wang | H01L 21/28088 |
| 10,147,600 | B2 | 12/2018 | Takamure et al. | |
| 11,725,280 | B2* | 8/2023 | Yoshida | H01L 21/0228 |
| | | | | 427/255.37 |
| 2005/0252449 | A1 | 11/2005 | Kher et al. | |
| 2006/0019501 | A1* | 1/2006 | Jin | H01L 21/3141 |
| | | | | 438/785 |
| 2006/0223337 | A1* | 10/2006 | Ahn | H01L 21/3142 |
| | | | | 438/785 |
| 2015/0376211 | A1* | 12/2015 | Girard | C23C 16/45553 |
| | | | | 556/412 |
| 2019/0311894 | A1* | 10/2019 | Girard | C23C 16/308 |

OTHER PUBLICATIONS

Choi, Jong Youn, et al., "Highly selective atomic layer deposition of MoSiOx using inherently substrate-dependent processes". Applied Surface Science, vol. 512, May 15, 2020, 144307, pp. 1-8.*

Won, Seok-Jun, et al., "High-Quality Low-Temperature Silicon Oxide by Plasma-Enhanced Atomic Layer Deposition Using a Metal-Organic Silicon Precursor and Oxygen Radical". IEEE Electron Device Letters, vol. 31, No. 8, Aug. 2010, pp. 857-859.*

\* cited by examiner

METHOD FOR FORMING METAL SILICON OXIDE AND METAL SILICON OXYNITRIDE LAYERS

CROSS-REFERENCE TO RELATED APPLICATIONS

This application is a continuation of, and claims priority to, U.S. patent application Ser. No. 17/408,940, now U.S. Pat. No. 11,725,280 B2, filed Aug. 23, 2021 titled METHOD FOR FORMING METAL SILICON OXIDE AND METAL SILICON OXYNITRIDE LAYERS; which claims the benefit of U.S. Provisional Patent Application Ser. No. 63/070,668 filed Aug. 26, 2020, the disclosures of which are hereby incorporated by reference in their entirety.

FIELD OF INVENTION

The present disclosure generally relates to methods of forming layers on a surface of a substrate, to structures including a layer, and to systems for forming the layers and structures. More particularly, the disclosure relates to methods of forming metal silicon oxide and metal silicon oxynitride layers, to structures including such layers, and to systems for forming the layers.

BACKGROUND OF THE DISCLOSURE

During the manufacture of electronic devices, fine patterns of features can be formed on a surface of a substrate by patterning the surface of the substrate and etching material from the substrate surface using, for example, wet etch and/or dry etch processes. As a density of devices on a substrate increases, it becomes increasingly desirable to form features with smaller dimensions.

Photoresist is often used to pattern a surface of a substrate prior to etching. A pattern can be formed in the photoresist by applying a layer of photoresist to a surface of the substrate, masking the surface of the photoresist, exposing the unmasked portions of the photoresist to radiation, such as ultraviolet light or an electron beam, and removing a portion (e.g., the unmasked or masked portion) of the photoresist, while leaving a portion of the photoresist on the substrate surface.

In some cases, photoresist may not exhibit a desired selectivity relative to the material to be etched. In such cases, a pattern can be transferred to a hard mask material, which can be used as an etch mask.

Hard masks can also be used to form relatively small features. For example, spacer defined double patterning (SDDP) techniques can utilize a hard mask to enable further pitch scaling of devices beyond limitations of conventional lithography techniques. Generally, SDDP techniques use a conformal spacer film and hard mask template. A silicon oxide layer is commonly used as a conformal spacer, and a hard mask template is typically prepared using a spin-on or CVD process.

In SDDP and other applications, it may be desirable to form a hard mask with desired optical properties and/or etch selectivity properties. Further, it may be desirable to easily tune such properties. Although prior techniques may work reasonably well, they may not be able to be finely tuned and/or offer the desired selectivity.

Further, some photolithography techniques, such as extreme ultraviolet photolithography techniques, often employ an underlayer to reduce reflectance of radiation used during a step of exposing the photoresist to radiation. Typical underlayers are generally relatively thick (e.g., greater than 20 nm) to meet desired etch selectivity. Further, typical underlayers can have undesirably high nonuniformity across a substrate surface. In some cases, stacks of materials are used as underlayers to obtain desired refractive index, extinction coefficient, adhesion to photoresist, and etch selectivity.

Accordingly, improved methods of forming layers, such as layers suitable for use with hard mask and underlayer applications, are desired. Further, structures including improved layers and systems for forming the improved layers are desired.

Any discussion of problems and solutions set forth in this section has been included in this disclosure solely for the purpose of providing a context for the present disclosure, and should not be taken as an admission that any or all of the discussion was known at the time the invention was made.

SUMMARY OF THE DISCLOSURE

Various embodiments of the present disclosure relate to methods of forming one or more of a metal silicon oxide layer and a metal silicon oxynitride layer on a surface of a substrate, to systems for forming the metal silicon oxide layers and metal silicon oxynitride layers, and to structures including such layers. The metal silicon oxide layer and metal silicon oxynitride layers can be used as underlayers and/or hard masks—e.g., during spacer defined double patterning (SDDP) processes.

While the ways in which various embodiments of the present disclosure address drawbacks of prior methods, systems, and structures are discussed in more detail below, in general, various embodiments of the disclosure provide improved methods of (e.g., finely) tuning properties of the metal silicon oxide layer and/or metal silicon oxynitride layer. Various techniques described herein provide layers suitable for use as underlayers and/or hard mark material and structures including a hard mark. However, unless otherwise noted, the disclosure and invention are not limited to such applications.

In accordance with exemplary embodiments of the disclosure, a method of forming one or more of a metal silicon oxide layer and a metal silicon oxynitride layer is provided. One or more exemplary methods include the steps of providing a substrate within a reaction chamber of a reactor, providing a silicon precursor to the reaction chamber for a silicon precursor pulse period, providing a first metal precursor to the reaction chamber for a first metal precursor pulse period, and providing a first reactant to the reaction chamber for a first reactant pulse period. In accordance with various aspects of these embodiments, the silicon precursor pulse period and the first metal precursor pulse period overlap. In accordance with other examples, the silicon precursor pulse period and the first metal precursor pulse period may not overlap. In this context, the term overlap means overlap in both space and time. In other words, during an overlap, for a period of time, both the silicon precursor and the first metal precursor are provided to the reaction chamber for a period of time. In accordance with further examples of the disclosure, the first metal precursor pulse period and the first reactant pulse period overlap. In accordance with further examples, a plasma is applied for a plasma period within the reaction chamber. In accordance with examples of the disclosure, the plasma period and the first reactant pulse period overlap. In accordance with further examples, the plasma period and the silicon precursor pulse period and/or the first metal precursor pulse period do not overlap. In some cases, the plasma may be continuous during one or more silicon precursor pulse periods and/or one or more first metal precursor pulse period and/or one or more reactant pulse periods. The first reactant pulse period can overlap with each of the silicon precursor pulse period and the first metal precursor pulse period. In accordance with additional examples, the method includes a step of providing a second reactant to the reaction chamber for a second reactant pulse period. One or more of the first reactant and the second reactant can include an oxygen reactant and the other of the first reactant and the second reactant comprises a nitrogen reactant. Some examples of the disclosure can be carried out as a chemical vapor deposition process—e.g., a plasma-enhanced CVD (PECVD) process. Some examples can be carried out as a plasma-enhanced cyclical deposition process, such as an atomic layer deposition (ALD process) (e.g., PEALD) process. In accordance with further examples of the disclosure, an optical constant of the metal silicon oxide layer or the metal silicon oxynitride layer is manipulated by manipulating a flowrate of one or more of the silicon precursor and the first metal precursor and/or a ratio of flowrates of the silicon precursor and the first metal precursor. In some cases, an optical constant of the metal silicon oxide layer or the metal silicon oxynitride layer can be manipulated by manipulating a flowrate of a carrier gas. As set forth in more detail below, further properties of a deposited layer can be manipulated by using a first deposition cycle that includes providing a first silicon precursor and a first metal precursor to a reaction chamber and a second deposition cycle that includes providing a second silicon precursor and a second metal precursor to the reaction chamber, wherein at least one of the first and second silicon precursors and/or at least one of the first and second metal precursors differ. The first deposition cycle can be repeated a number of m times and/or the second deposition cycle can be repeated a number of n times prior to proceeding to a next step in the method. The selection of the precursors and/or number of cycles can be used to desirably alter properties of the deposited layer.

In accordance with further embodiments of the disclosure, a structure is provided. The structure can be formed according to a method as set forth herein. The structure can include a substrate and one or more of a metal silicon oxide layer and a metal silicon oxynitride layer. An extinction coefficient of the metal silicon oxide layer or the metal silicon oxynitride layer can be between about 0 and about 1.3. A refractive index of the metal silicon oxide layer or the metal silicon oxynitride layer can be between about 1.4 and about 3.0. A thickness of the metal silicon oxide layer and the metal silicon oxynitride layer can be less than 20 nm.

In accordance with yet additional examples of the disclosure, a system configured to perform a method and/or form a structure as described herein is provided.

These and other embodiments will become readily apparent to those skilled in the art from the following detailed description of certain embodiments having reference to the attached figures; the invention not being limited to any particular embodiment(s) disclosed.

BRIEF DESCRIPTION OF THE DRAWING FIGURES

A more complete understanding of exemplary embodiments of the present disclosure can be derived by referring to the detailed description and claims when considered in connection with the following illustrative figures.

Figure 1:
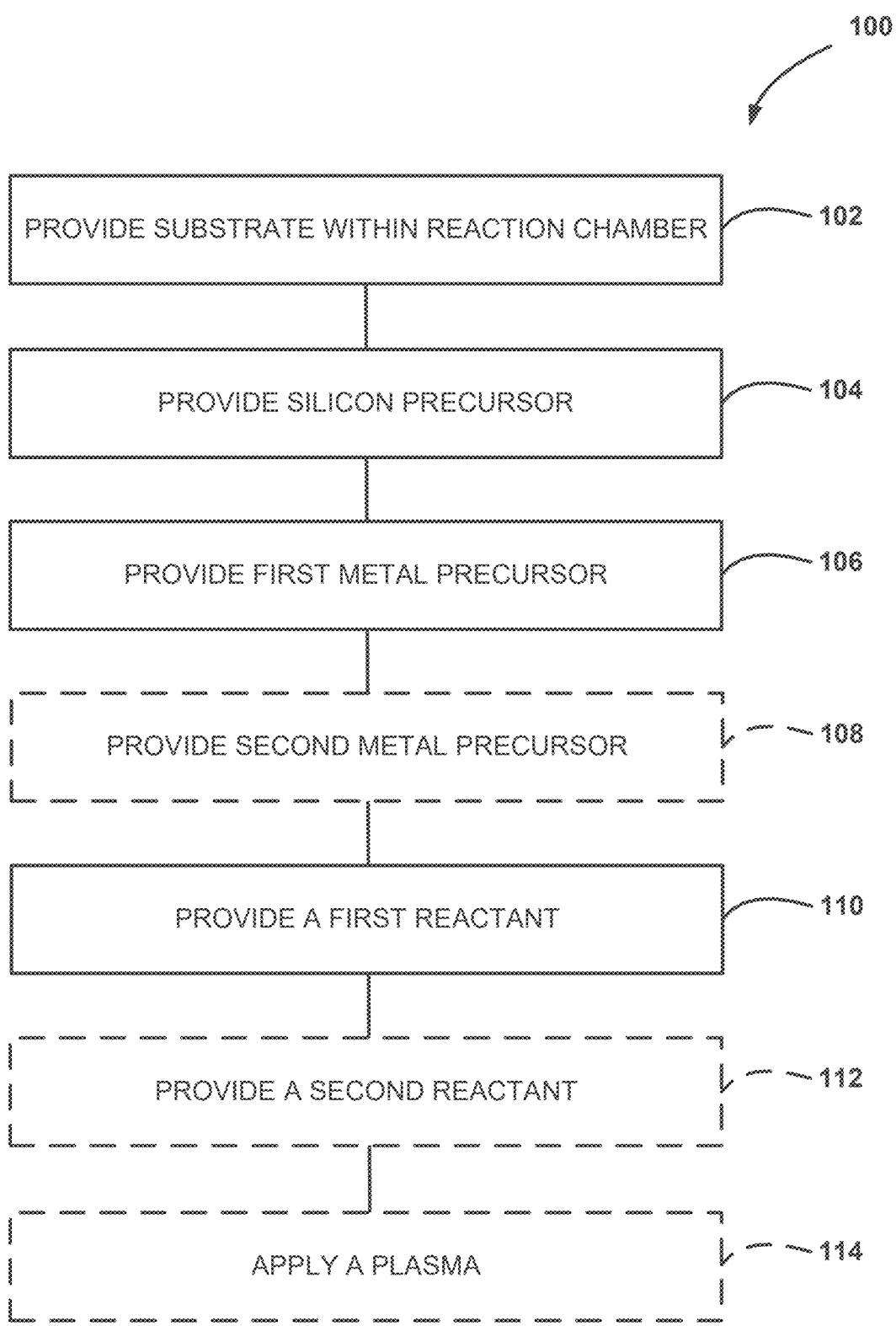
FIG. 1 illustrates a method in accordance with at least one embodiment of the disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

Although certain embodiments and examples are disclosed below, it will be understood by those in the art that the invention extends beyond the specifically disclosed embodiments and/or uses of the invention and obvious modifications and equivalents thereof. Thus, it is intended that the scope of the invention disclosed should not be limited by the particular disclosed embodiments described below.

The present disclosure generally relates to methods of forming metal silicon oxide layers and metal silicon oxynitride layers on a surface of a substrate, to structures including the metal silicon oxide layers and/or metal silicon oxynitride layers—e.g., formed using methods described herein, and to systems for performing the methods and/or forming the structures. As described in more detail below, exemplary methods can be used to form metal silicon oxide layers and/or metal silicon oxynitride layers with desirable properties and/or allow easy tuning of the properties, such as refractive index, extinction coefficient and/or etch selectivity with another layer, such as silicon oxide (e.g., stochiometric or non-stochiometric silicon dioxide). The metal silicon oxide layers and metal silicon oxynitride layers described herein can be for a variety of applications, such as for forming hard masks and/or underlayers during the formation of electronic devices. However, unless noted otherwise, the disclosure and invention is not so limited.

In this disclosure, gas may include material that is a gas at normal temperature and pressure, a vaporized solid and/or a vaporized liquid, and may be constituted by a single gas or a mixture of gases, depending on the context. A gas other than the process gas, i.e., a gas introduced without passing through a gas distribution assembly, such as a showerhead, other gas distribution device, or the like, may be used for, e.g., sealing the reaction space, and may include a seal gas, such as a rare or other inert gas. The term inert gas refers to a gas that does not take part in a chemical reaction to an appreciable extent and/or a gas that can excite a precursor when plasma power is applied. The terms precursor and reactant can be used interchangeably.

As used herein, the term substrate can refer to any underlying material or materials that may be used to form, or upon which, a device, a circuit, or a film may be formed. A substrate can include a bulk material, such as silicon (e.g., single-crystal silicon), other Group IV materials, such as germanium, or compound semiconductor materials, such as GaAs, and can include one or more layers overlying or underlying the bulk material. Further, the substrate can include various features, such as recesses, lines, and the like formed within or on at least a portion of a layer of the substrate. By way of particular examples, a substrate can include a dielectric layer, such as a silicon oxide.

In some embodiments, film refers to a layer extending in a direction perpendicular to a thickness direction to cover an entire target or concerned surface, or simply a layer covering a target or concerned surface. In some embodiments, layer refers to a structure having a certain thickness formed on a surface or a synonym of film or a non-film structure. A layer can be continuous or noncontinuous. A film or layer may be constituted by a discrete single film or layer having certain characteristics or multiple films or layers, and a boundary between adjacent films or layers may or may not be clear and may or may not be established based on physical, chemical, and/or any other characteristics, formation processes or sequence, and/or functions or purposes of the adjacent films or layers.

In this disclosure, continuously can refer to one or more of without breaking a vacuum, without interruption as a timeline, without any material intervening step, without changing treatment conditions, immediately thereafter, as a next step, or without an intervening discrete physical or chemical structure between two structures other than the two structures in some embodiments.

The term cyclic deposition process or cyclical deposition process can refer to the sequential introduction of precursors (and/or reactants) into a reaction chamber to deposit a layer over a substrate and includes processing techniques, such as atomic layer deposition (ALD), cyclical chemical vapor deposition (cyclical CVD), and hybrid cyclical deposition processes that include an ALD component and a cyclical CVD component.

As used herein, the term atomic layer deposition (ALD) may refer to a vapor deposition process in which deposition cycles, preferably a plurality of consecutive deposition cycles, are conducted in a process chamber. Typically, during each cycle, a precursor is introduced and may be chemisorbed to a deposition surface (e.g., a substrate surface or a previously deposited underlying surface such as material from a previous ALD cycle), forming a monolayer or sub-monolayer that does not readily react with additional precursor (i.e., a self-limiting reaction). Thereafter, a reactant (e.g., another precursor or reaction gas) may subsequently be introduced into the process chamber for use in converting the chemisorbed precursor to the desired material on the deposition surface. Typically, this reactant is capable of further reaction with the precursor. Further, purging steps may also be utilized during each cycle to remove excess precursor from the process chamber and/or remove excess reactant and/or reaction byproducts from the process chamber after conversion of the chemisorbed precursor. Further, the term atomic layer deposition, as used herein, is also meant to include processes designated by related terms, such as chemical vapor atomic layer deposition, atomic layer epitaxy (ALE), molecular beam epitaxy (MBE), gas source MBE, or organometallic MBE, and chemical beam epitaxy when performed with alternating pulses of precursor composition(s), reactive gas, and purge (e.g., inert carrier) gas. PEALD refers to an ALD process, in which a plasma is applied during one or more of the ALD steps.

As used herein, silicon oxide refers to a material that includes silicon and oxygen. Silicon oxide can be represented by the formula $SiO_x$, where x can be between 1 and 2 (e.g., $SiO_2$). In some cases, the silicon oxide may not include stoichiometric silicon oxide. In some cases, the silicon oxide can include other elements, such as carbon, nitrogen, hydrogen, or the like.

As used herein, metal silicon oxide layer refers to a material that includes at least one metal, silicon, and oxygen. The metal silicon oxide can be represented by $Si_1M_xO_z$, where x is about 0.1 to about 1 or about 0.01 to about 2 and z is about 1.5 to about 2 or about 1 to about 3. M can be or include a transition metal, such as titanium, hafnium, tantalum, tungsten, zirconium, and yttrium.

A metal silicon oxynitride layer includes at least one metal (M), silicon, oxygen, and nitrogen. The metal silicon oxynitride can be represented by $Si_1M_xO_zN_{zz}$, where x is about 0.1 to about 1 or about 0.01 to about 2, z is about 1 to about 2 or about 0.5 to about 1.5, and zz is about 0.3 to about 1 or about 0.1 to about 1. M can be or include any of the metals noted above in connection with the metal silicon oxide layer.

Further, in this disclosure, any two numbers of a variable can constitute a workable range of the variable, and any ranges indicated may include or exclude the endpoints. Additionally, any values of variables indicated (regardless of whether they are indicated with about or not) may refer to precise values or approximate values and include equivalents, and may refer to average, median, representative, majority, or the like in some embodiments. Further, in this disclosure, the terms including, constituted by and having can refer independently to typically or broadly comprising, consisting essentially of, or consisting of in some embodiments. In this disclosure, any defined meanings do not necessarily exclude ordinary and customary meanings in some embodiments.

$SiO_xN_yC_z$ (where x ranges from 0.5 to about 2, y ranges from about 0.1 to about 1.5, and z ranges from about 0.1 to about 1.5) layers can be used as hard mask layers. Optical constants of such layers can be adjusted. However, etch (e.g., dry etch) selectivity with respect to a dielectric layer, such as silicon oxide, can be less than desired, particularly in cases of SDDP processes. To overcome these shortcomings, laminate films of layers comprising titanium and other layers comprising silicon have been developed. However, such laminate films have several shortcomings. For example, a film thickness of the laminate is limited to an integral multiple of the laminated layers. Further, when there is a difference in etching rate between the layers of the laminate structure, roughness may occur on the side wall of etch regions formed within the laminate structure, which may lead to a final increase in roughness in an etch region formed in a subsequently etched (e.g., silicon oxide) layer for which the hard mask layer is used to template. Methods and structures described herein address these issues.

Turning now to the figures, FIG. 1 illustrates a method 100 of forming one or more of a metal silicon oxide layer and a metal silicon oxynitride layer in accordance with at least one embodiment of the disclosure. Method 100 includes the steps of providing a substrate within a reaction chamber (step 102), providing a silicon precursor to the reaction chamber for a silicon precursor pulse period (step 104), providing a first metal precursor to the reaction chamber for a first metal precursor pulse period (step 106), and providing a first reactant to the reaction chamber for a first reactant pulse period (step 110). As illustrated, method 100 can also include a step of applying a plasma for a plasma period within the reaction chamber (step 114) and/or a step of providing a second metal precursor to the reaction chamber for a second metal precursor pulse period (step 108) and/or a step of providing a second reactant to the reaction chamber for a second reactant pulse period (step 112). As set forth in more detail below, two or more steps of method 100 can overlap, and unless otherwise noted, the illustrated steps need not be performed in the order listed. For example, the silicon precursor pulse period and the first metal and/or second metal precursor pulse period can overlap (e.g., in time and within the reaction chamber). Additionally or alternatively, step 110 and/or 112 can precede and overlap one or more of steps 104, 106, and/or 108. Further, various steps may be repeated prior to proceeding to the next step. In accordance with further examples, two or more steps may not overlap.

During step 102, a substrate can be loaded onto a susceptor within a reaction chamber. Once the substrate is loaded onto the susceptor, a gate valve can be closed. In some cases, the susceptor can be moved to an operating position. A temperature within the reaction chamber during step 102 can be brought to a temperature for subsequent processing—e.g., between about 75° C. and about 400° C. Similarly, a pressure within the reaction chamber may be controlled to provide a reduced atmosphere in the reaction chamber for subsequent processing. For example, the pressure within the reaction chamber can be brought to less than 5000 Pa, or less than 2000 Pa, or less than 1000 Pa, or be between about 100 Pa and about 1000 Pa or about 10 Pa and about 1000 Pa.

During step 104, a silicon precursor is provided to the reaction chamber for a silicon precursor pulse period. During this step, the temperature and/or pressure can be as set forth above in connection with step 102.

The silicon precursor can be heated to a melting temperature or higher, a sublimation temperature or higher, or a boiling temperature or higher. By way of examples, the silicon precursor can be heated to a temperature of about 40° C. to about 70° C., about 25° C. to about 100° C., or about ° C. to about ° C.

In accordance with various examples of the disclosure, the silicon precursor can be or include a silane, an aminosilane, a methoxysilane, and/or an ethoxysilane. By way of particular examples, the silicon precursor can include one or more of bisdiethylaminosilane (BDEAS), (3-methoxypropil)trimethoxysilane, and tetraethoxysilane.

Exemplary silicon precursor flowrates during step 104 can be about 10 sccm to about 1000 sccm. A pulse time for a silicon precursor flow during step 104 can be about 0.05 seconds to about 2 seconds.

As described in more detail below, a carrier gas can be used to facilitate providing the silicon precursor to the reaction chamber. In these cases, a flowrate of the carrier gas can be between about 0.05 and about 3 standard liters per minute (slpm). Exemplary carrier gasses include one or more of Ar, $N_2$ and He.

During step 106, the first metal precursor is provided to the reaction chamber for a first metal precursor pulse period. During this step, the temperature and/or pressure within the reaction chamber can be as set forth above in connection with steps 102 and 104.

The first metal precursor can be heated to a melting temperature or higher, a sublimation temperature or higher, or a boiling temperature or higher. By way of examples, the first metal precursor can be heated to a temperature of about 40° C. to about 70° C., or about 25° C. to about 100° C.

In accordance with various examples of the disclosure, the first metal precursor can be or include one or more of a titanium precursor, a hafnium precursor, a tantalum precursor, a tungsten precursor, a zirconium precursor, and an yttrium precursor. In some cases, the first metal precursor comprises a metal atom (e.g., titanium, hafnium, tantalum, or tungsten) directly bonded to one or more of a nitrogen atom and an oxygen atom. In some cases, the first metal precursor can be or include a metal organic precursor (e.g., comprising one or more of titanium, hafnium, tantalum, and tungsten). The first metal precursor can be or include an alkyl amide or an alkoxide (e.g., comprising one or more of titanium, hafnium, tantalum, and tungsten). By way of particular examples, the first metal precursor can comprise titanium or tantalum. Particular example titanium precursors can be selected from the group consisting of titanium isopropoxide tetrakis(dimethylamino)titanium, titanium-tetrachloride, tetrakis-dimethylamido-titanium, and titanium isopropoxide. Particular examples tantalum precursors can be tris(diethylamido)(tert-butylimido)tantalum(V) (TBT-DET) and tantalum tris(diethylamido)-tert-butylimide.

Exemplary first metal precursor flowrates during step 106 can be about 10 sccm to about 1000 sccm. A pulse time for a first metal precursor flow during step 106 can be about 0.05 seconds to about 2 seconds.

Similar to the above for the silicon precursor, a carrier gas can be used to facilitate providing the first metal precursor to the reaction chamber. In these cases, a flowrate of the carrier gas can be between about 0.05 and about 3 slpm. The carrier gas can be as noted above.

During step 108, a second metal precursor is provided to the reaction chamber for a second metal precursor pulse period. As noted above, this step is optional. Some embodiments of the disclosure may not include providing the second metal precursor to the reaction chamber.

During step 108, the temperature and/or pressure within the reaction chamber can be as set forth above in connection with steps 102, 104, and 106. The second metal precursor can be selected from one or more of any of the first metal precursors noted above. A flowrate and pulse time of and during the second metal precursor pulse period can be the same or similar to those noted above in connection with the first metal precursor pulse period. The metal in the second metal precursor can be different than the metal in the first metal precursor. The second metal precursor can be provided to the reaction chamber with the assistance of a carrier gas. In these cases, the flowrate of the carrier gas can be between about 0.05 and about 3 slpm. Further, the second metal precursor can be heated to the same or similar temperatures noted above in connection with the first metal precursor prior to entering the reaction chamber. In accordance with particular embodiments of the disclosure, the second metal precursor comprises hafnium.

During step 110, a first reactant is provided to the reaction chamber for a first reactant pulse period. During this step, the temperature and/or pressure within the reaction chamber can be as set forth above in connection with steps 102-108.

As discussed below, the first reactant pulse period can overlap with one or more or all of the steps 104-108. For example, the silicon precursor pulse period, the first metal precursor pulse period, optionally the second metal precursor pulse period, and the first reactant pulse period can overlap.

Exemplary first reactant flowrates during step 110 can be about 10 sccm to about 3000 sccm. The first reactant flow during step 110 can be continuous through one or more deposition cycles.

The first reactant can include an oxygen reactant and/or a nitrogen reactant. Exemplary oxygen reactants can be selected from one or more reactants in the group consisting of oxygen ($O_2$), CO, $CO_2$, $N_2O$, $O_3$, and $H_2O$. Exemplary nitrogen reactants can be selected from one or more reactants in the group consisting of nitrogen ($N_2$) and $NH_3$. In some cases, a carrier gas can be provided during step 110. In these cases, a flowrate of the carrier gas to the reaction chamber can be about 0.05 to about 3 slpm.

When used, step 112 can be the same or similar to step 110. The temperature and/or pressure during step 112 can be the same or similar to the temperature and pressure in step 110. The flowrates of the second reactant and pulse times can be as noted above for the first reactant. Or, a total flow rate of both reactants, alone or with any carrier gas, can be about 0.05 to about 3 slpm.

In some cases, one or more of the first reactant and the second reactant comprises an oxygen reactant and the other of the first reactant and the second reactant comprises a nitrogen reactant. The oxygen and/or nitrogen reactants can be as noted above in connection with step 110.

During optional step 114, a plasma is applied for a plasma period. The plasma can be provided within or exterior (remote) to the reaction chamber. A frequency of power to produce the plasma can be between about 400 kHz and about 30 MHz. A power to produce the plasma can be between about 50 W and about 1000 W. When applied as a direct plasma (within the reaction chamber), a spacing between electrodes can be between about 7 mm and about 20 mm. The temperature and pressure within the reaction chamber during step 114 can be the same or similar to the temperature and pressure described above in connection with steps 104-112. Exemplary processes described herein may be performed with or without plasma.

Table 1 below illustrates exemplary process conditions for steps 104-114.

TABLE 1

| Conditions for Steps 104-114 | |
|---|---|
| RC Pressure | 100-1000 Pa |
| Susceptor temperature | 50-400° C. |
| Flow rate of silicon precursor | 0.05-3 slm |
| Flow rate of first metal precursor | 0.05-3 slm |
| Flow rate of second metal precursor | 0-3 slm |
| Flowrate of first reactant | 0.05-3 slm |
| Flowrate of second reactant | 0-3 slm |
| Flowrate of sealing gas | 50-1000 sccm |
| Direct plasma power | 50-1000 W |
| Distance between electrodes | 7-20 mm |
| Duration of silicon precursor pulse | 0.05-2 sec |
| Duration of first metal precursor pulse period | 0.05-2 sec |
| Duration of second metal precursor pulse period | 0.05-2 sec |
| Duration of first reactant pulse period | Continuous |
| Duration of second reactant pulse period | Continuous |
| Duration of plasma period | 0.05-2 sec |

Figure 2:
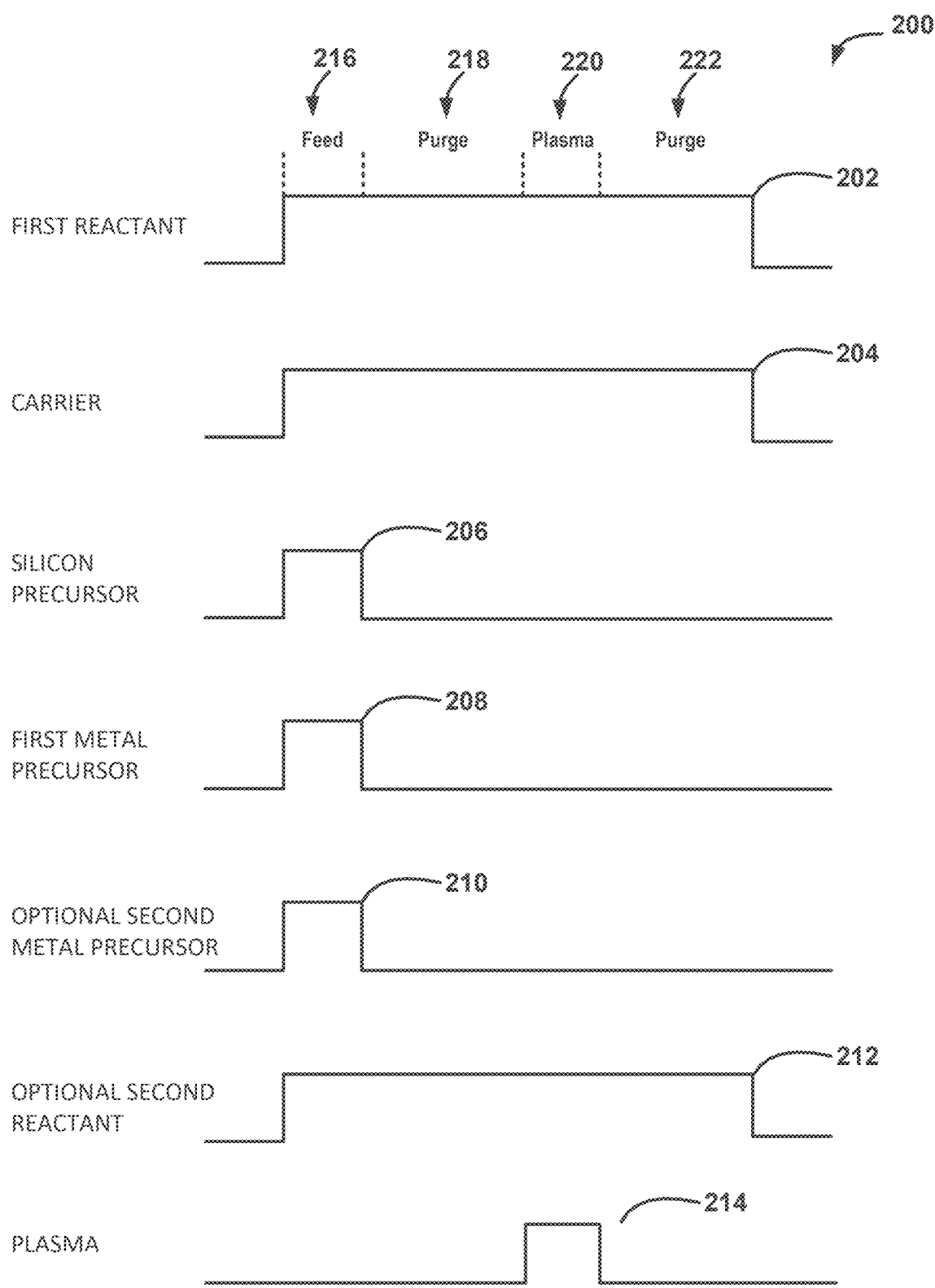
FIG. 2 illustrates a timing sequence in accordance with at least one embodiment of the disclosure.

FIG. 2 illustrates a timing sequence 200 suitable for use with method 100. Timing sequence 200 includes a first reactant pulse period 202, a carrier pulse period 204, a silicon precursor pulse period 206, a first metal precursor pulse period 208, an optional second metal precursor pulse period 210, an optional second reactant pulse period 212, and a plasma period 214. Steps/pulse period of timing sequence 200 can be repeated a number of times to obtain a silicon oxide layer or a metal silicon oxynitride layer of desired thickness.

During first reactant pulse period 202, a first reactant is provided to the reaction chamber. The first reactant, pulse time, flowrate, and temperatures can be as noted above in connection with step 110.

During carrier pulse period 204, a carrier gas can be supplied to the reaction chamber. As set forth in more detail below, the carrier gas can be diverted to one or more of a silicon precursor source, a first metal precursor source, and/or a second metal precursor source to facilitate delivery of the respective precursor(s). The flowrate of the carrier gas can be between about 0.05 and about 3 slpm. The carrier gas can be a carrier gas as noted above in connection with method 100.

During silicon precursor pulse period 206, a silicon precursor is provided to the reaction chamber. The silicon precursor and the process conditions during silicon precursor pulse period 206 can be the same or similar to those described above in connection with step 104 and Table 1.

During first metal precursor pulse period 208, a first metal precursor is provided to the reaction chamber. The first metal precursor and the process conditions during first metal precursor pulse period 208 can be the same or similar to those described above in connection with step 106 and Table 1.

During optional second metal precursor pulse period 210, a second metal precursor is provided to the reaction chamber. The second metal precursor and the process conditions during second metal precursor pulse period 210 can be the same or similar to those described above in connection with step 108 and Table 1.

During optional second reactant pulse period 212, a second reactant is provided to the reaction chamber. The second reactant, pulse time, flowrate, and temperatures, and the like can be as noted above in connection with step 112 and Table 1.

During plasma period 214, plasma power is provided to electrodes to produce a plasma. The process conditions for plasma period 214 can be as described above in connection with step 114 and Table 1.

As illustrated in FIG. 2, timing sequence 200 can be segmented into a feed segment 216, a first purge segment 218, a plasma segment 220, and a second purge segment 222. During feed segment 216, the first reactant, the second reactant (if present), the carrier gas, the silicon precursor, the first metal precursor, and optionally the second metal precursor can be provided to the reaction chamber—e.g., the flow of such precursors and reactants within the reaction chamber can overlap. As illustrated, the silicon precursor pulse period 206 and the first metal precursor pulse period 208 can overlap. Indeed, each of the first reactant pulse period 202, carrier pulse period 204, silicon precursor pulse period 206, first metal precursor pulse period 208, optional second metal precursor pulse period 210, and optional second reactant pulse period 212 can overlap (e.g., during feed segment 216). Further, the plasma period 214 and the first reactant pulse period 202 and/or the second reactant pulse period 212 can overlap (e.g., during plasma segment 220). In accordance with further examples of the disclosure, the plasma period 214 and the silicon precursor pulse period 206, first metal precursor pulse period 208, and/or optional second metal precursor pulse period 210 do not overlap. In these cases, one or more of the precursors are not subject to a plasma excitation.

During first purge segment 218 and second purge segment 222, a carrier or inert gas can flow through the reaction chamber. Additionally, as illustrated in FIG. 2, one or more of the first reactant and the second reactant can flow through the reaction chamber to further facilitate purging of the reactor.

Figure 8:
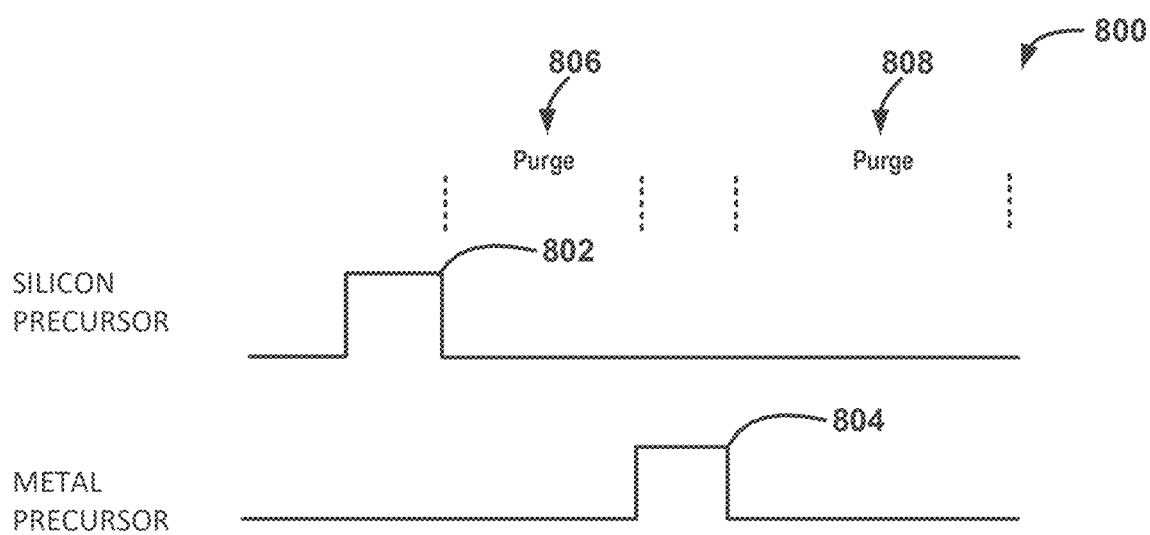
FIGS. 8-15 illustrate timing sequences in accordance with at least one embodiment of the disclosure.

FIG. 8 illustrates a precursor timing sequence 800 suitable for use with method 100 according to another embodiment. In timing sequence 800, a metal silicon oxide is deposited using a cyclical process, such as plasma-enhanced ALD. Timing sequence 800 includes a silicon precursor pulse period 802 followed by a first purge period 806, and a metal precursor pulse period 804 followed by a second purge period 808. Steps/pulse period of timing sequence 800 can be repeated a number of times to obtain a metal silicon oxide layer of desired thickness.

During silicon precursor pulse period 802, a silicon precursor is provided to the reaction chamber. The silicon precursor and the process conditions during silicon precursor pulse period 802 can be the same or similar to those described above in connection with step 104 and Table 1.

During metal precursor pulse period 804, a metal precursor is provided to the reaction chamber. The metal precursor and the process conditions during metal precursor pulse period 804 can be the same or similar to those described above in connection with step 106 and Table 1. During first purge period 806 and second purge period 808, a carrier or inert gas can flow through the reaction chamber. In some cases, a plasma can be applied before, during or after any of step 802-808. The plasma conditions can be as described above in connection with FIG. 1.

Figure 9:
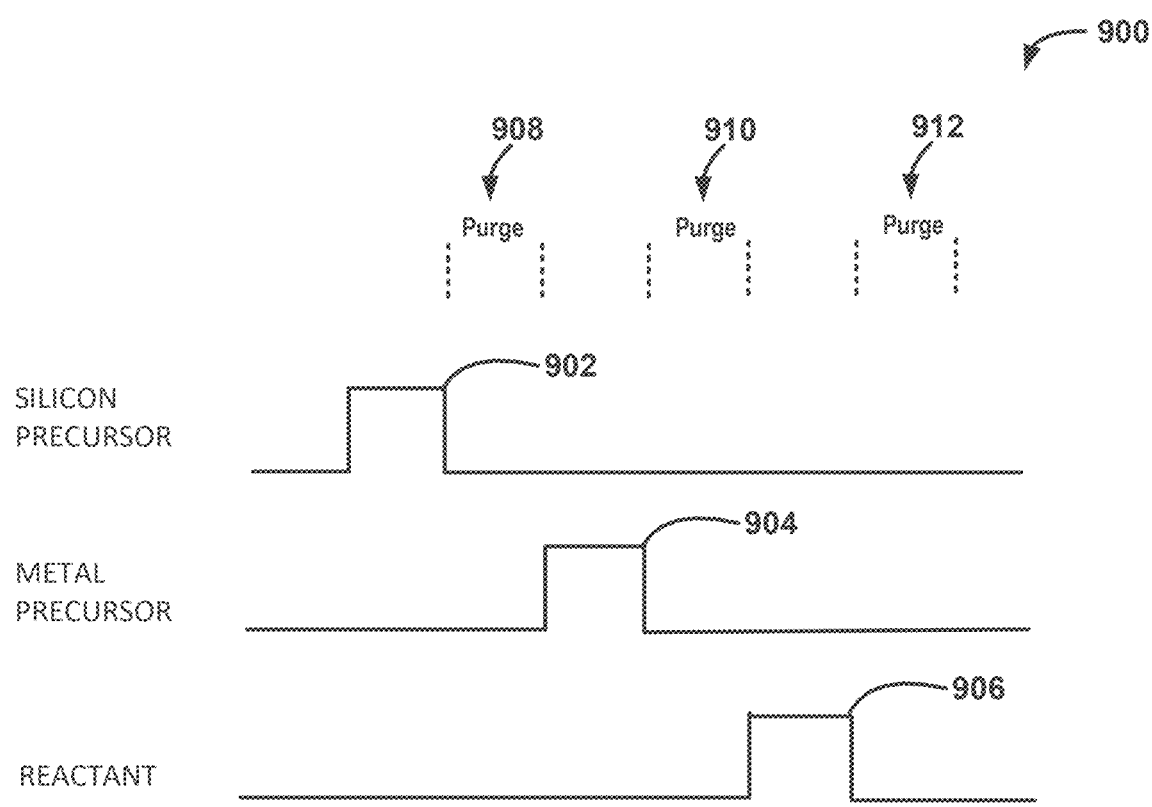

FIG. 9 illustrates a precursor and reactant timing sequence 900 suitable for use with method 100 according to another embodiment. In timing sequence 900, a metal silicon oxide is prepared using a cyclical process, such as plasma-enhanced ALD. Timing sequence 900 includes a silicon precursor pulse period 902 followed by a first purge period 908, a metal precursor pulse period 904 followed by a second purge period 910, and a reactant period 906 followed by a third purge period 912. Steps/pulse period of timing sequence 900 can be repeated a number of times to obtain a metal silicon oxide layer of desired thickness.

During silicon precursor pulse period 902, a silicon precursor is provided to the reaction chamber. The silicon precursor and the process conditions during silicon precursor pulse period 902 can be the same or similar to those described above in connection with step 104 and Table 1.

During metal precursor pulse period 904, a metal precursor is provided to the reaction chamber. The metal precursor and the process conditions during metal precursor pulse period 904 can be the same or similar to those described above in connection with step 106 and Table 1. During first purge period 908, second purge period 910, and third purge period 912, a carrier or inert gas can flow through the reaction chamber. During reactant period 906, a reactant is provided to the reaction chamber. The reactant, pulse time, flowrate, and temperatures can be as noted above in connection with step 110. In some cases, a plasma can be applied before, during or after any of steps 902-912. The plasma conditions can be as described above in connection with FIG. 1.

Figure 10:
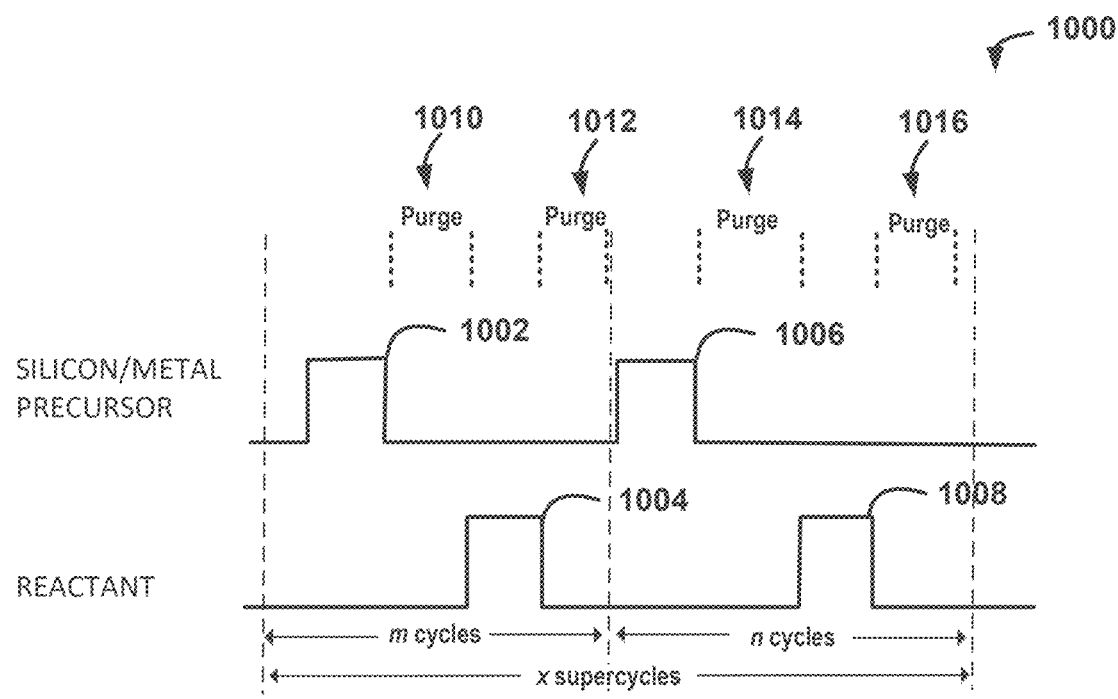

FIG. 10 illustrates another precursor and reactant timing sequence 1000 suitable for use with method 100 according to another embodiment. In timing sequence 1000, a metal silicon oxide is prepared using a cyclical process, such as plasma-enhanced ALD. Timing sequence 1000 includes a silicon precursor pulse period 1002 followed by a first purge period 1010, a first reactant period 1004 followed by a second purge period 1014, a metal precursor pulse period 1006 followed by a third purge period 1014, and a second reactant period 1008 followed by a fourth purge period 1016. Steps/pulse period of silicon 1002 and first reactant 1004 (a cycle) can be repeated a number of times (m) before steps/pulse period of metal precursor 1006 and second reactant 1008 (another cycle), which can be repeated a number of times (n) before the full timing sequence 1000 is repeated. Steps/pulse period of timing sequence 1000 can be repeated a number of times (x) to obtain a metal silicon oxide layer of desired thickness. Further, a number of cycles m and a number of cycles n can be independently varied to obtain a desired composition and/or properties (e.g., refractive index and extinction coefficient). By way of examples, m can range from about 0 to about 10, n can range from about 0 to about 10, and x can range from about 1 to about 1000. In some embodiments, first reactant 1004 and second reactant 1006 are different. In other embodiments, first reactant 1004 and second reactant 1006 are the same. Further, different or the same silicon and/or metal precursors can be used during steps 1002 and 1006. Changing the precursors and/or reactants for the m cycles and the n cycles provides additional control of desired properties of the deposited layers. In some cases, a composition can be controlled to obtain desired properties including adhesion with subsequently-deposited photoresist, etch selectivity, and/or optical properties, which allows for use of thinner layers (e.g., less than 20 nm).

Figure 11:
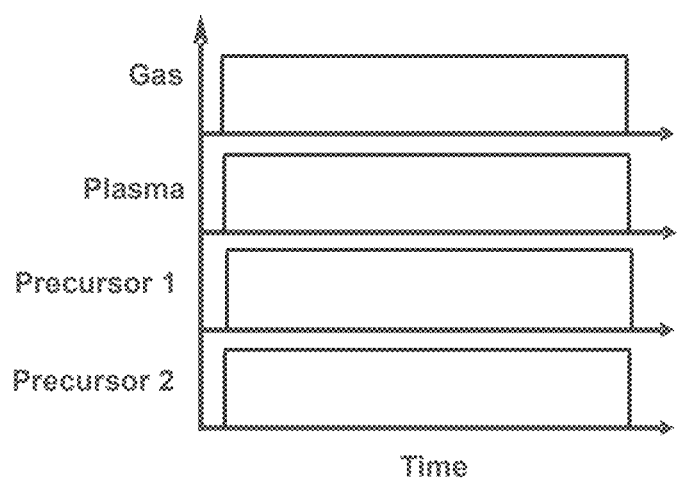

FIGS. 11-15 illustrate gas (e.g., reactant), plasma, and precursor timing sequences suitable for use with method 100, in which a metal silicon oxide is prepared by plasma-enhanced CVD and/or a plasma-enhanced cyclical process according to additional embodiments. In FIG. 11, a silicon precursor (Precursor 1) and a metal precursor (Precursor 2) are flowed into the reaction chamber, such that there is overlap in the flow of Precursor 1 and Precursor 2 to the reaction chamber. In addition, a plasma pulse period overlaps with the flow of Precursor 1 and Precursor 2 to the reaction chamber. The method of FIG. 11 can be a typical PECVD process.

Figure 12:
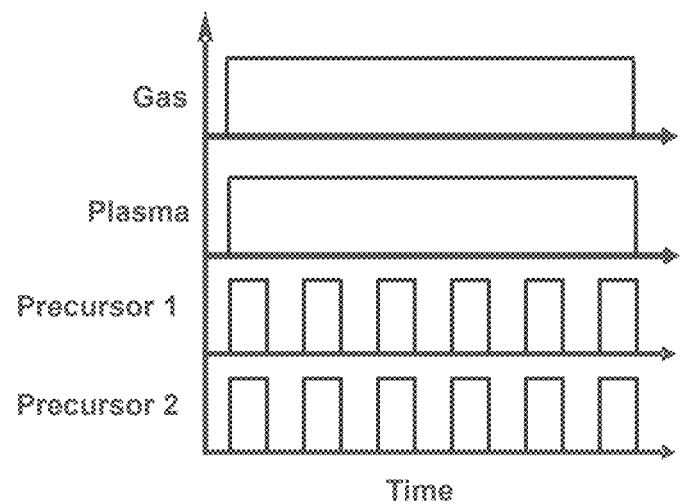

In FIG. 12, the silicon precursor (Precursor 1) and the metal precursor (Precursor 2) are pulsed into the reaction chamber in an overlapping manner. The gas and plasma power are provided continuously through a plurality of Precursor 1 and Precursor 2 pulses.

Figure 13:
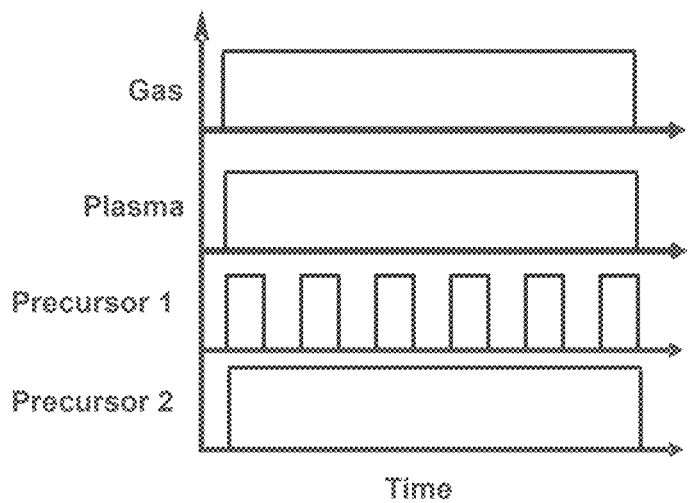

In FIG. 13, the silicon precursor (Precursor 1) is pulsed into the reaction chamber while the metal precursor (Precursor 2) is flowed continuously into the reaction chamber. In this case, the gas and plasma power can be provided continuously through one or more precursor 1 pulses.

Figure 14:
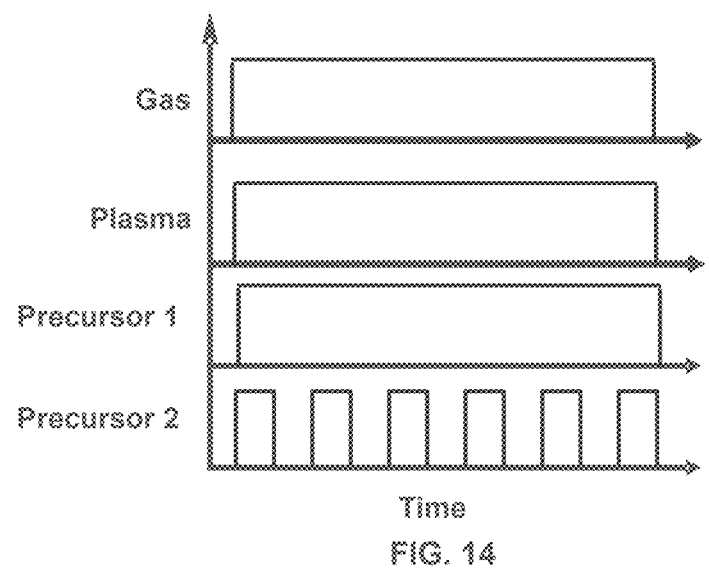

In FIG. 14, the silicon precursor (Precursor 1) is flowed continuously into the reaction chamber while the metal precursor (Precursor 2) is pulsed into the reaction chamber. Similar to the case above, the gas and plasma power can be provided continuously through one or more precursor 2 pulses.

Figure 15:
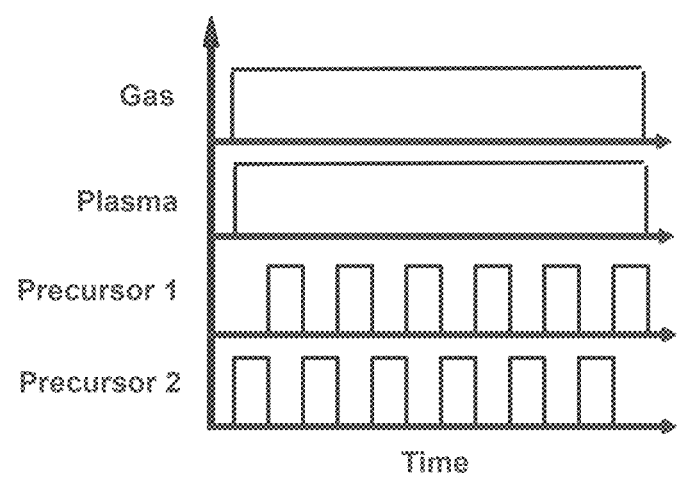

In FIG. 15, the silicon precursor (Precursor 1) is pulsed into the reaction chamber, and the metal precursor (Precursor 2) is pulsed into the reaction chamber, where during each pulse, one of the precursors is ceased at about the same time as the other precursor is introduced. For example, Precursor 2 is introduced less than one second or less than 0.5 seconds after Precursor 1 is ceased, and vice versa. In some cases, there may be a period of overlap with Precursor 1 pulse and Precursor 2 pulses. In other cases, there may be no overlap or substantially no overlap with Precursor 1 pulses and Precursor 2 pulses. In the timing sequences illustrated in FIGS. 11-15, gas and plasma power are provided continuously.

An optical constant, such as refractive index (n) and extinction coefficient (n) can be adjusted or manipulated by, for example, manipulating a flowrate or a ratio of flowrates of one or more of the silicon precursor and the first and/or second metal precursor and/or a ratio of flowrates of the silicon precursor and the first and/or second metal precursor. For example, the optical constant of the metal silicon oxide layer or the metal silicon oxynitride layer can be manipulated by manipulating a flowrate of a carrier gas, which is used to facilitate delivery of one or more of the silicon precursor, the first metal precursor, and the second metal precursor.

Figure 4:
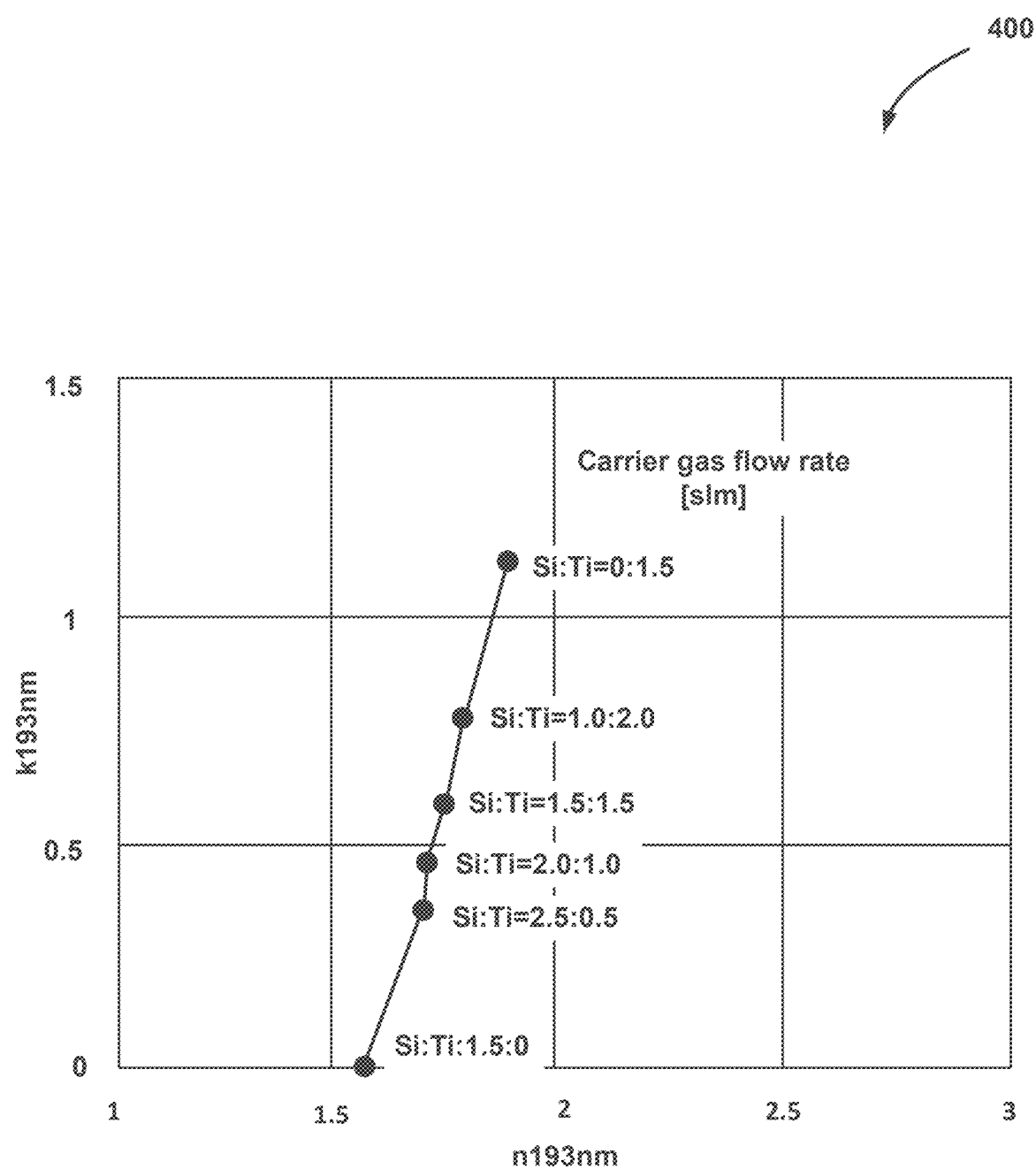
FIGS. 4 and 5 illustrate optical properties of layers formed in accordance with at least one embodiment of the disclosure.
Figure 5:
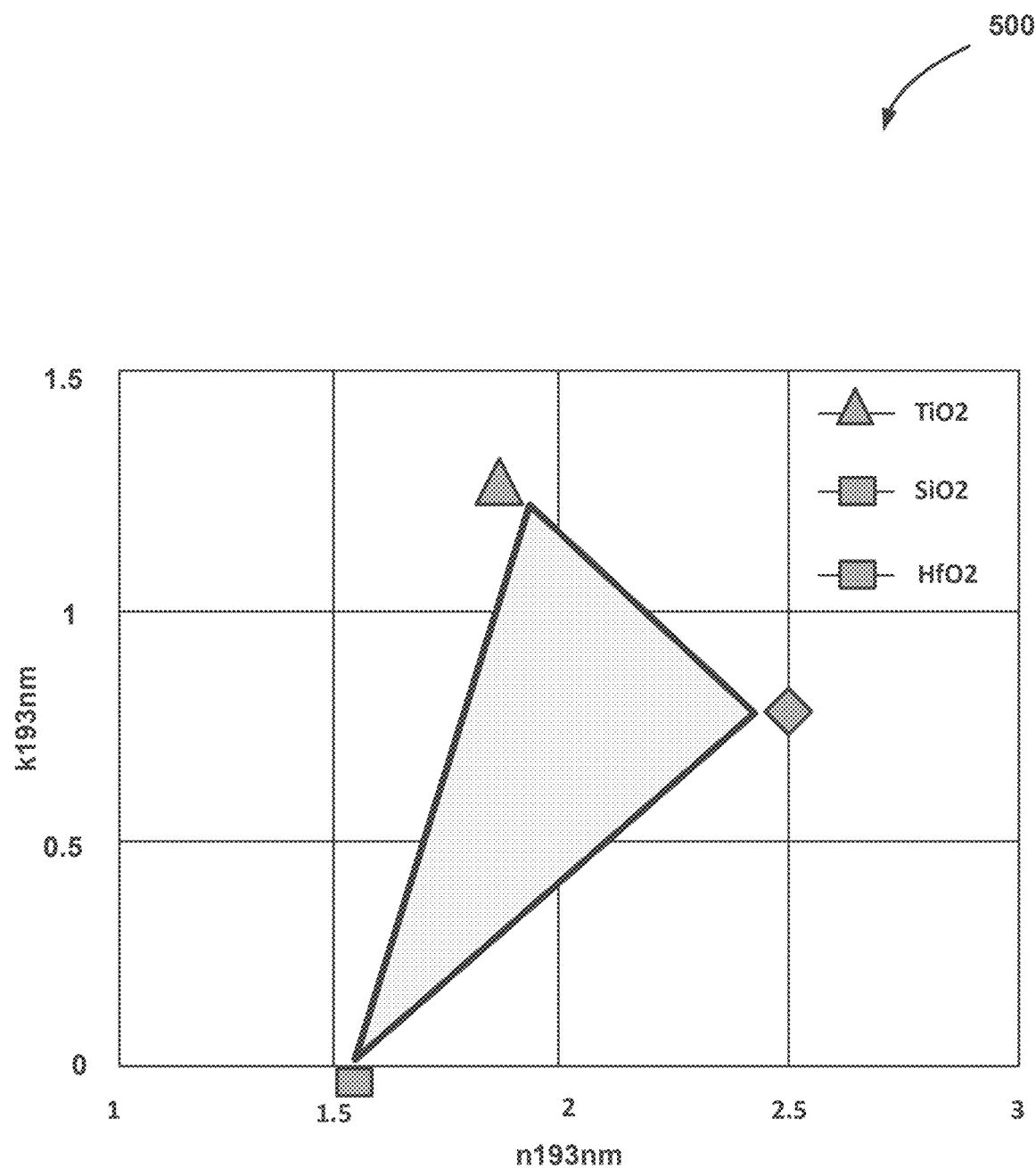

FIG. 4 illustrates varying refractive index values and extinction coefficients for silicon precursor flowrate: first metal precursor flowrates of 0:1.5, 1:2, 1.5:1.5, 2:1, 2.5:0.5, and 1.5:0 (flowrates are in slpm). FIG. 5 illustrates a range of values for refractive index and extinction coefficient (within the shaded triangle) for a titanium hafnium silicon oxide layer. A value within the shaded triangle region can be obtained based on respective flowrates of the silicon, first metal, and second metal precursors. Although illustrated for titanium, silicon, and hafnium, other metals can be used as described herein.

Figure 16:
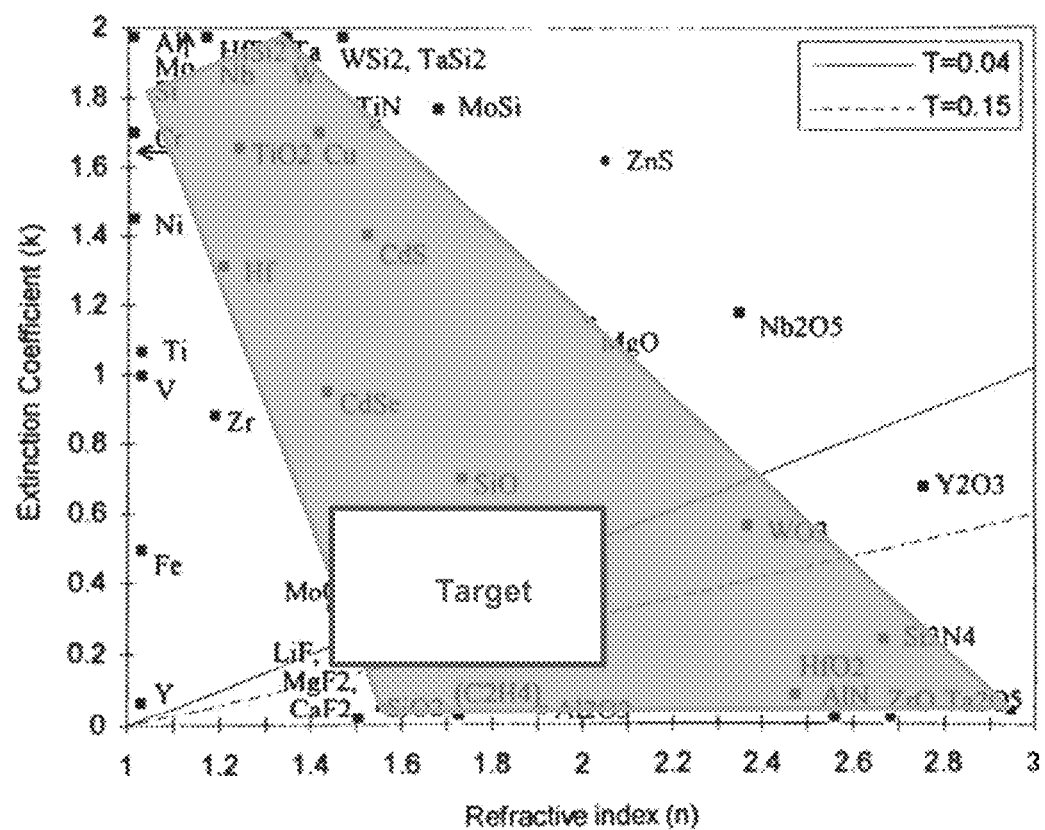
FIG. 16 illustrates optical properties of layers formed in accordance with at least one embodiment of the disclosure.

FIG. 16 illustrates a range of values refractive index and extinction coefficient (within the shaded partial triangle) for a tantalum silicon oxide layer. Tantalum silicon oxide spans a large parameter range, including target values illustrated by the rectangle.

Figure 3:
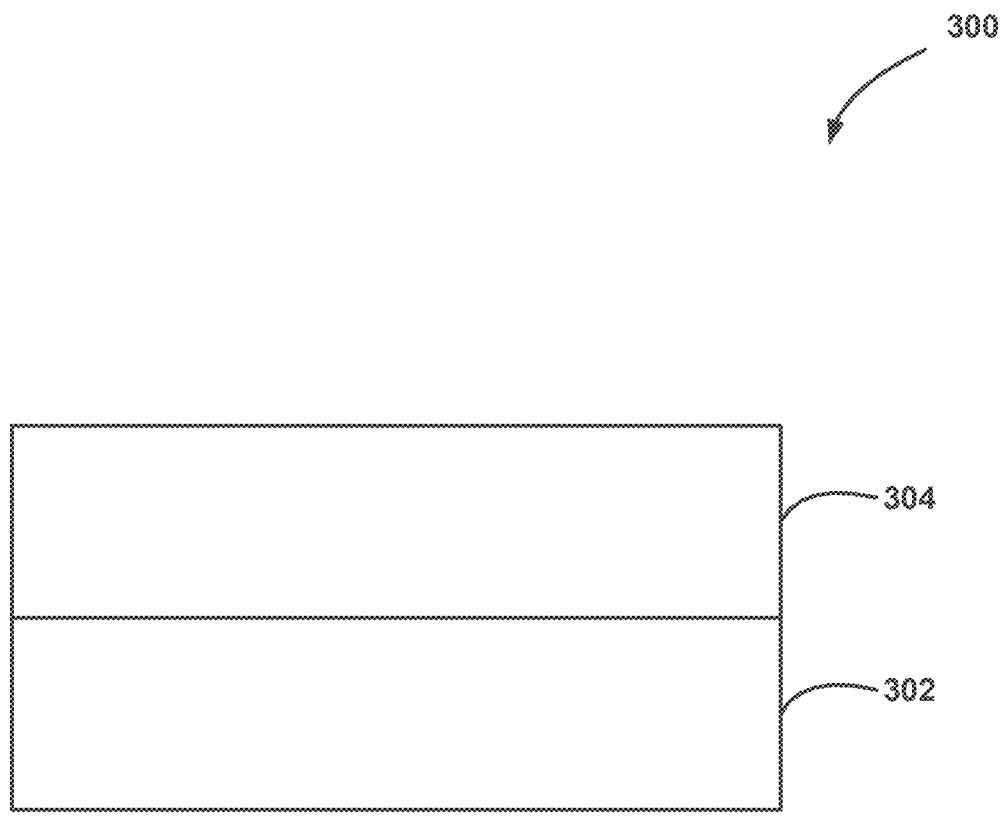
FIG. 3 illustrates a structure in accordance with at least one embodiment of the disclosure.

FIG. 3 illustrates a structure 300 in accordance with exemplary embodiments of the disclosure. Structure 300 can be formed, at least in part, according to a method as described herein, such as method 100.

Structure 300 includes a substrate 302 and one or more of a metal silicon oxide layer and a metal silicon oxynitride layer formed, e.g., using method 100 and/or timing sequence 200. A thickness of layer 304 can vary by application. For example, the thickness can be between about 1 nm and about 100 nm.

As noted above, methods as described herein allow for easy manipulation of one or more optical constants (e.g., refractive index and extinction coefficient). In accordance with examples of the disclosure, an extinction coefficient of the metal silicon oxide layer or the metal silicon oxynitride layer 304 is between about 0 and about 1.3. Additionally or alternatively, a refractive index of the metal silicon oxide layer or the metal silicon oxynitride layer 304 can be between about 1.4 and about 3.0.

Figure 6:
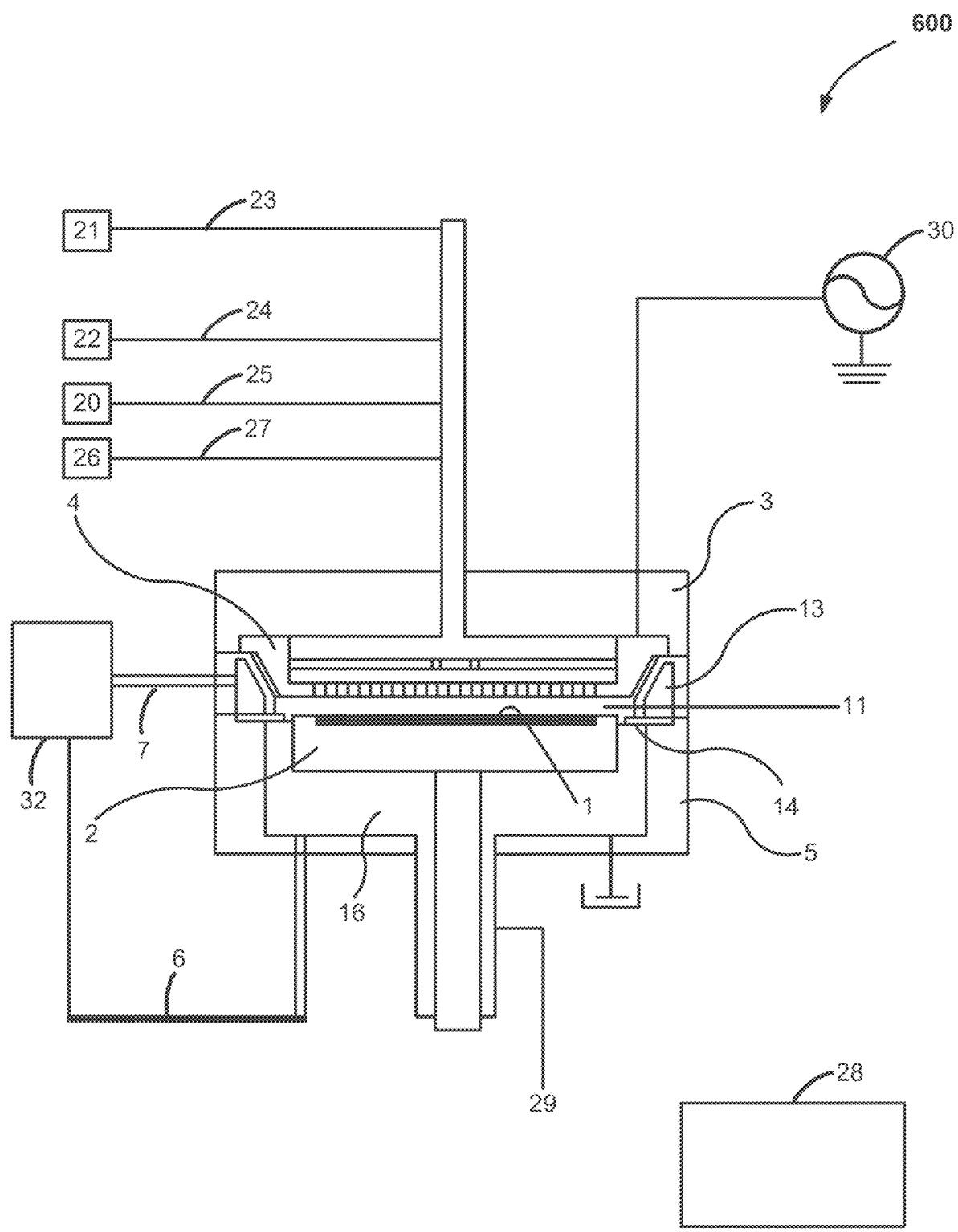
FIG. 6 illustrates a system in accordance with at least one embodiment of the disclosure.

Turning now to FIG. 6, a reactor system 600 is illustrated in accordance with exemplary embodiments of the disclosure. Reactor system 600 can be used to perform one or more steps or substeps as described herein and/or to form one or more structures or portions thereof as described herein.

Reactor system 600 includes a pair of electrically conductive flat-plate electrodes 4, 2 in parallel and facing each other in the interior 11 (reaction zone) of a reaction chamber 3. Although illustrated with one reaction chamber, system 600 can include two or more reaction chambers. A plasma can be excited within reaction chamber 3 by applying, for example, HRF power (e.g., 100 kHz, 13.56 MHz, 27 MHz, 2.45 GHZ, or any values therebetween) from plasma power source 30 to one electrode (e.g., electrode 4) and electrically grounding the other electrode (e.g., electrode 2). A temperature regulator can be provided in a lower stage 2 (the lower electrode), and a temperature of a substrate 1 placed thereon can be kept at a desired temperature, such as the substrate temperatures noted above. Electrode 4 can serve as a gas distribution device, such as a shower plate or showerhead. Precursor gases, oxygen and/or nitrogen reactant gases, and a carrier or inert gas, if any, or the like can be introduced into reaction chamber 3 using one or more of a gas line 23, a gas line 24, a gas line 25, and a gas line 27, from sources 21, 22, 20, and 26, respectively, and through the shower plate 4. Although illustrated with four gas lines 23, 24, 25, and 26, reactor system 600 can include any suitable number of gas lines. By way of examples, source 21 can correspond to a silicon precursor source, source 22 can correspond to a first reactant (e.g., one or more of an oxygen reactant source and a nitrogen reactant source), source 20 can correspond to a first metal source, and source 26 can correspond to a second metal source or a second reactant source.

In reaction chamber 3, a circular duct 13 with an exhaust line 7 can be provided, through which gas in the interior 11 of the reaction chamber 3 can be exhausted. Additionally, a transfer chamber 5, disposed below the reaction chamber 3, can be provided with a seal gas line 29 to introduce seal gas into the interior 11 of the reaction chamber 3 via the interior 16 (transfer zone) of the transfer chamber 5, wherein a separation plate 14 for separating the reaction zone and the transfer zone can be provided (a gate valve through which a substrate is transferred into or from the transfer chamber 5 is omitted from this figure). The transfer chamber can also be provided with an exhaust line 6 coupled to exhaust source 32. In some embodiments, two or more (e.g., all) of the steps of method 100 and/or sequence 200 can be conducted without exposing the substrate to air or other oxygen-containing atmosphere.

Figure 7:
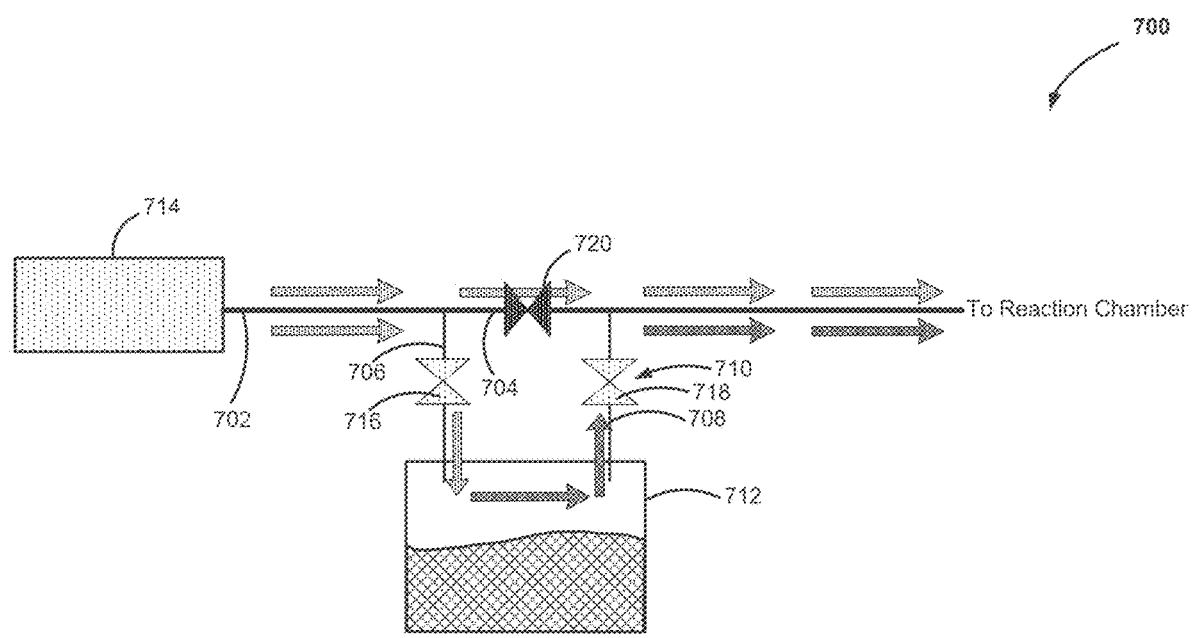
FIG. 7 illustrates a precursor delivery system for use in accordance with at least one embodiment of the disclosure.

In some embodiments, continuous flow of a carrier gas to reaction chamber 3 can be accomplished using a flow-pass system (FPS) 700, illustrated in FIG. 7. In this case, a carrier gas line 702 can be provided with a detour line 704 and a path 710 including lines 706, 708, and a precursor vessel 712. When only a carrier gas is intended to be fed to a reaction chamber, detour line 704 and a valve 720 are open. When both the carrier gas and a precursor gas are intended to be fed to the reaction chamber, the carrier gas can flow through line 706 and a valve 716 and out from precursor vessel 712 through line 708 and a valve 718, together with the precursor gas. In this way, the carrier gas can continuously flow into the reaction chamber 3, and can carry the precursor gas in pulses by switching between lines 704 and 706, without substantially fluctuating pressure of reaction chamber 3. Further, an amount of precursor gas fed to reaction chamber 3 can be controlled by adjusting an amount of carrier gas supplied to vessel 712 (e.g., using a flow controller 714 and/or valve 716).

Reactor system 600 can include one or more controller(s) 28 programmed or otherwise configured to cause one or more method steps as described herein to be conducted. Controller(s) 28 are coupled with the various power sources, heating systems, pumps, robotics and gas flow controllers, or valves of the reactor, as will be appreciated by the skilled artisan. By way of example, controller 28 can be configured to control gas flow of a silicon precursor, a first metal precursor, a first reactant, and carrier gas into at least one of the one or more reaction chambers to form a metal silicon oxide layer or a metal silicon oxynitride layer on a surface of a substrate. As noted above, gas flow of the silicon precursor and gas flow of the first metal precursor can overlap within the at least one of the one or more reaction chambers. The controller can be similarly configured to perform additional steps as described herein.

In some embodiments, a dual chamber reactor (two sections or compartments for processing substrates disposed close to each other) can be used, wherein a reactant gas and a noble gas can be supplied through a shared line, whereas a precursor gas is supplied through unshared lines.

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to the embodiments shown and described herein, such as alternative useful combinations of the elements described, may become apparent to those skilled in the art from the description. Such modifications and embodiments are also intended to fall within the scope of the appended claims.

What is claimed is:

1. A method of forming one or more of a metal silicon oxide layer and a metal silicon oxynitride layer, the method comprising the steps of:
   providing a substrate within a reaction chamber of a reactor;
   providing a silicon precursor to the reaction chamber for a silicon precursor pulse period;
   providing a first metal precursor to the reaction chamber for a first metal precursor pulse period; and
   providing a first reactant to the reaction chamber for a first reactant pulse period,
   wherein the first reactant pulse period overlaps with the silicon precursor pulse period and the first metal precursor pulse period, and
   wherein a plasma is applied for a plasma period during the step of providing the first reactant.

2. The method according to claim 1, wherein the silicon precursor pulse period, the first metal precursor pulse period and the first reactant pulse period overlap.

3. The method according to claim 1, comprising forming the metal silicon oxynitride layer.

4. The method according to claim 1, wherein the plasma period and the silicon precursor pulse period do not overlap.

5. The method according to claim 1, wherein the plasma period and the first metal precursor pulse period do not overlap.

6. The method according to claim 1, wherein the first reactant pulse period is continuous through one or more deposition cycles.

7. The method according to claim 1, further comprising a step of providing a second metal precursor to the reaction chamber for a second metal precursor pulse period.

8. The method according to claim 7, wherein the second metal precursor comprises one or more of a titanium precursor, a hafnium precursor, a tantalum precursor, and a tungsten precursor, and wherein a metal in the second metal precursor is different than a metal in the first metal precursor.

9. The method according to claim 8, wherein the titanium precursor is selected from the group consisting of titanium isopropoxide and tetrakis(dimethylamino)titanium.

10. The method according to claim 7, wherein one or both of the first metal precursor and the second metal precursor comprise a metal atom directly bonded to one or more of a nitrogen atom and an oxygen atom.

11. The method according to claim 7, wherein one or both of the first metal precursor and the second metal precursor comprise a metal organic precursor.

12. The method according to claim 7, wherein one or both of the first metal precursor and the second metal precursor comprise an alkyl amide or an alkoxide.

13. The method according to claim 1, further comprising a step of providing a second reactant to the reaction chamber for a second reactant pulse period, wherein the second reactant pulse period overlaps with the first reactant pulse period.

14. The method according to claim 13, wherein one of the first reactant and the second reactant comprises an oxygen reactant and the other of the first reactant and the second reactant comprises a nitrogen reactant.

15. The method according to claim 14, wherein the oxygen reactant is selected from the group consisting of oxygen ($O_2$), CO, $CO_2$, $N_2O$, $O_3$, and $H_2O$.

16. The method according to claim 14, wherein the nitrogen reactant is selected from the group consisting of nitrogen ($N_2$) and $NH_3$.

17. The method according to claim 1, wherein the silicon precursor comprises a silane, an aminosilane, a methoxysilane, and/or an ethoxysilane.

18. The method according to claim 17, wherein the silicon precursor is selected from the group consisting of bisdiethylaminosilane, (3-methoxypropil)trimethoxysilane, and tetraethoxysilane.

19. The method according to claim 1, wherein the first metal precursor comprises one or more of a titanium precursor, a hafnium precursor, a tantalum precursor, and a tungsten precursor.

20. The method according to claim 1, wherein an optical constant of the metal silicon oxide layer or the metal silicon oxynitride layer is manipulated by manipulating a flowrate of one or more of the silicon precursor and the first metal precursor and/or a ratio of flowrates of the silicon precursor and the first metal precursor.

* * * * *